United States Patent [19]

Cabaud

[11] Patent Number: 4,477,969
[45] Date of Patent: Oct. 23, 1984

[54] DEVICE FOR INSERTING CONTACTS ON A SUPPORT CARD

[75] Inventor: Aimé Cabaud, Velizy, France

[73] Assignee: Societe Comatel S.A., Rungis, France

[21] Appl. No.: 393,514

[22] Filed: Jun. 29, 1982

[30] Foreign Application Priority Data

Jul. 3, 1981 [FR] France ................. 81 13367

[51] Int. Cl.³ .................. H01K 43/00; H05K 3/30
[52] U.S. Cl. ........................ 29/739; 29/235;
29/747; 29/844; 29/881
[58] Field of Search ............. 29/739, 747, 235, 842,
29/844, 881, 884

[56] References Cited

U.S. PATENT DOCUMENTS 4,015,322 4/1977 Cabaud .................. 29/739

Primary Examiner—Carl E. Hall
Attorney, Agent, or Firm—Karl F. Ross; Herbert Dubno

[57] ABSTRACT

A device for inserting on a card for supporting a hybrid circuit or printed circuit, contacts connected together so as to form an assembly and each comprising, at one of their ends, a clip element oriented perpendicularly to the planes of the contacts and adapted to engage on the support card. The device comprises a fixed card support, a frame which is mobile in the longitudinal direction of the support and on which are mounted to be elastically mobile two rollers forming guide rollers for the contact assemblies, the clip elements of the contacts being at the level of the card placed on this support, a jack for displacing this frame, and means for connecting, as desired, the assemblies of contacts on the one hand with the fixed support and on the other hand with the mobile frame.

3 Claims, 4 Drawing Figures

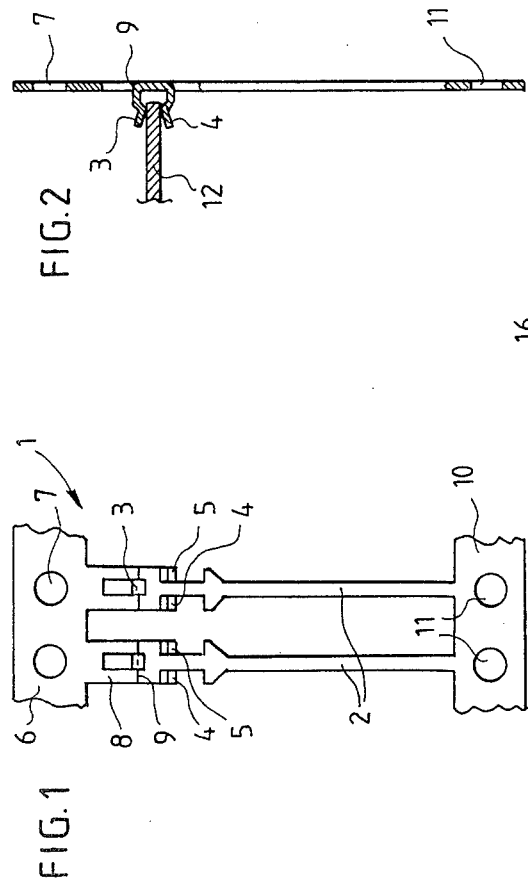
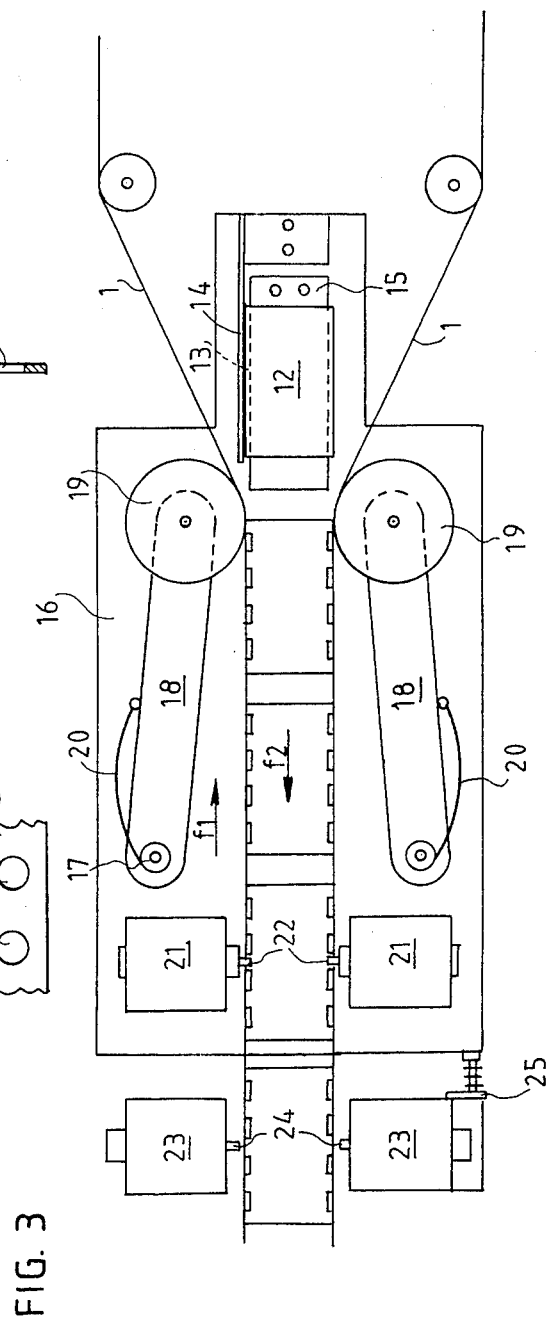
FIG.1
FIG.2
FIG.3

DEVICE FOR INSERTING CONTACTS ON A SUPPORT CARD

FIELD OF THE INVENTION

The present invention relates to a device for inserting contacts on a support card.

BACKGROUND OF THE INVENTION

Assemblies of contacts to be soldered are known for hybrid circuits or printed circuit cards, which are connected by two lateral strips, in which the contacts each comprise, at one of their ends, a clip element oriented perpendicularly to the plane of the contacts and adapted to engage on a hybrid circuit, and which are initially connected to one another at each of their ends.

OBJECT OF THE INVENTION

It is an object of the present invention to provide a device for inserting an assembly of contacts on cards for supporting hybrid circuits or printed circuit cards.

SUMMARY OF THE INVENTION

The device according to the invention comprises a fixed card support, a frame mobile in the longitudinal direction of the support and on which are mounted so as to be elastically mobile two rollers forming guide rollers for the assemblies of contacts, the clip elements of the contacts being at the level of the card placed on this support, a jack for displacing this frame, and means for connecting, as desired, the assemblies of contacts on the one hand with the fixed support and on the other hand with the mobile frame.

To use this device, a card is placed on the fixed support, the contact assemblies are connected to this support so that said assemblies are immobilized, and the mobile frame which drives the rollers is displaced towards the support. The latter press on the edges of the card placed on the support the contact assemblies whose clip elements engage progressively on these edges. At the end of movement, the contact assemblies are disconnected from the fixed support, these assemblies and the mobile frame are joined together and this frame is returned to its initial position which drives the contact assemblies and the card inserted between these assemblies. The cycle of operations which has just been described is then restarted.

The means for joining the contact assemblies with the fixed support and with the mobile frame are advantageously constituted by jacks which are respectively fixed and carried by the mobile frame, and adapted to control fingers which may engage in holes provided in the contact assemblies.

BRIEF DESCRIPTION OF THE DRAWING

The invention will be more readily understood on reading the following description with reference to the accompanying drawing, in which:

FIG. 1 is a view in elevation of part of an assembly of contacts.

FIG. 2 is a view in section of this assembly and shows the clip element of a contact engaged on a card for supporting a hybrid circuit.

FIGS. 3 and 4 are plan views of the device in two different positions.

SPECIFIC DESCRIPTION

Figure 4:
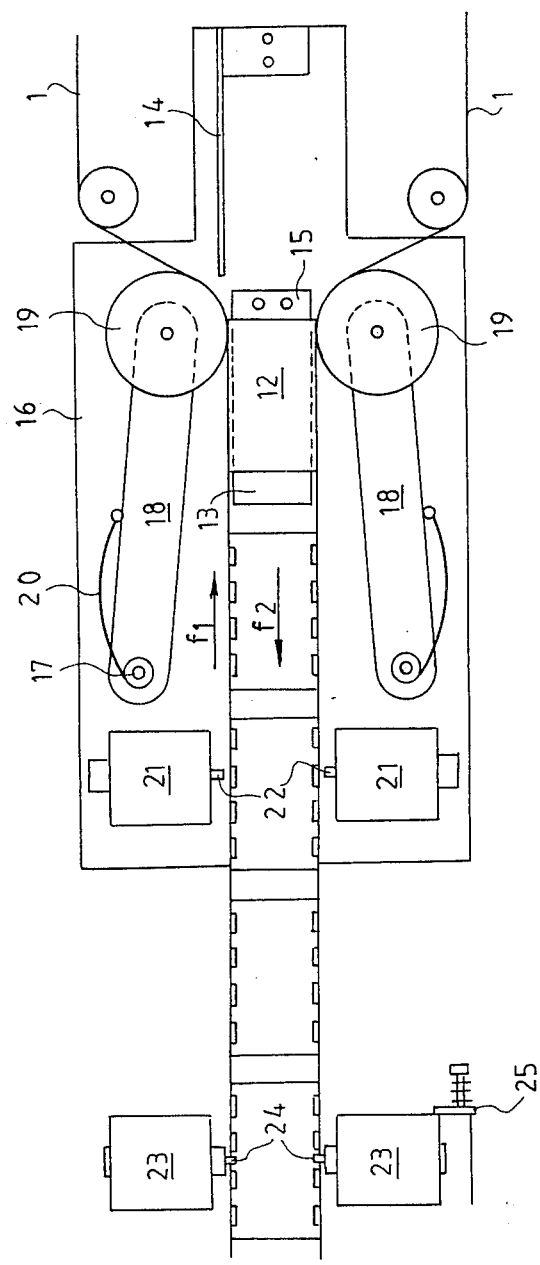

Referring now to the drawings, FIGS. 1 and 2 show a web or assembly 1 of contacts 2. Each of these contacts comprises an elongated body terminated at one of its ends by a clip element which is oriented perpendicularly to the axis of the body; this clip element is formed by a central elastic leaf 3 and by two leaves 4 and 5 which, longitudinally, are spaced apart from the leaf 3, and, transversely, are disposed on either side of this leaf. The contacts 2 are connected, at their ends comprising the clip element, by a strip 6 provided with a hole 7 in the axis of each of the contacts 2; connection between the strip and the contact is ensured via portions 8 of reduced width, and an incipient crack 9 is provided at the end of contact 2, in the immediate vicinity of the leaf 3. Furthermore, at their opposite ends, the contacts 2 are connected by a strip 10 perforated with a hole 11 opposite each contact. The particular purpose of holes 7 and 11 is to allow the advance of the web 1 on the one hand during manufacture of the contacts, and, on the other hand, durng positioning of the contacts on a card 12 forming a support for a hybrid circuit.

The purpose of the device according to the invention is to insert two contact assemblies 1 on each opposite side of a series of cards 12.

This device comprises a fixed elongated support 13 on which a card 12 may be placed and which bears an end stop 15 for this card. A frame 16 is mounted to move parallel to the longitudinal direction of the support 13 and is connected to the rod of the piston of a control jack (not shown); this frame bears lateral stops 14 for the card 12.

On the frame 16 are pivoted at 17 two levers 18 at the end of each of which is rotatably mounted a roller 19 serving to guide a web of contact assemblies 1. These rollers are disposed so that the clip elements of the contacts are at the level of a card 12 placed on the support 13. The levers 18 are subjected to the action of springs 20 which tend to apply the rollers 19 on the webs of contacts 1 and, consequently, these contact to the edge of the card 12 placed on the support 13.

On the end of the frame 16 opposite the support 13 are mounted two jacks 21 whose piston rods bear fingers 22, each adapted to engage in a hole 11 in a strip 10. Two fixed jacks 23 are provided near the jacks 21; the piston rod of each of them bears a finger 24 adapted to engage in a hole 11.

In FIG. 3, the fingers 22 are engaged in holes 11; on the other hand, fingers 24 are disengaged from the holes 11.

A card 12 is placed on the support 13 and the positions of the jacks 21 and 23 are reversed, so that fingers 24 engage in holes 11 and fingers 22 are disengaged therefrom. The control jack of the support 16 is then actuated, so that the latter moves in the direction of arrow $f_1$.

Further to this movement, the rollers 19 apply on the card 12 which is axially immobilized by the stop 15, the webs 1 whose clip elements 3-4-5 are inserted on the edges of the card. At the end of stroke of the jack, the plate 12 is mounted over the whole of its length in the clip elements of the contacts (FIG. 4).

All that remains is to reverse the positions of the jacks 21 and 23 again so that the fingers 24 are disengaged from holes 11 and that fingers 22 are engaged in these holes, this joining the webs 1 and the frame 16, and to return this frame into its initial position. The frame drives, in the direction of arrow $f_2$, opposite that of arrow $f_1$, the webs which in turn drive the card 12 which has just been inserted therebetween. The stroke of the frame 16 is determined for example by an adjustable stop 25, so that, after insertion of the cards in the clip elements of the contact assemblies, the cards are slightly spaced apart from one another.

A new card is then inserted and the operations which have just been described are repeated.

It is obvious that the present invention must not be considered as being limited to the embodiment described and shown, but, on the contrary, covers all the variants thereof.

What I claim is:

1. A device for inserting on a card for supporting a hybrid circuit or printed circuit, contacts connected together so as to form an assembly and each comprising, at one of their ends, a clip element oriented perpendicularly to the planes of the contacts and adapted to engage on the support card, said device comprising an elongate fixed card support, a frame which is mobile in a longitudinal direction of the support and on which are mounted in elastically mobile manner two rollers forming guide rollers for the contact assemblies, the clip elements of the contacts being at the level of a card on this support, a jack for displacing this frame, and means for alternately connecting the contact assemblies with the fixed support and with the mobile frame.

2. The device of claim 1, wherein the means for connecting the contact assemblies with the fixed support and with the mobile frame are constituted by jacks which are respectively fixed and carried engaging in holes provided in the contact assemblies.

3. The device of claim 1 or 2, wherein the rollers are mounted to rotate on levers pivoted on the mobile frame and subjected to the action of springs tending to pivot them in the direction corresponding to engagement on the edges of a card of the clip elements of the contact assemblies.

* * * * *